(12) United States Patent
Iacoboae (10) Patent No.: US 11,204,259 B2
(45) Date of Patent: Dec. 21, 2021

(54) METHOD AND A SYSTEM FOR OBTAINING INFORMATION FROM A UTILITY METER

(71) Applicant: NORTHQ APS, København Ø (DK)

(72) Inventor: Dan Iacoboae, Bagsværd (DK)

(73) Assignee: NorthQ ApS, København Ø (DK)

( * ) Notice: Subject to any disclaimer, the term of this patent is extended or adjusted under 35 U.S.C. 154(b) by 157 days.

(21) Appl. No.: 16/475,418

(22) PCT Filed: Jan. 2, 2018

(86) PCT No.: PCT/EP2018/050057
§ 371 (c)(1),
(2) Date: Jul. 2, 2019

(87) PCT Pub. No.: WO2018/127489
PCT Pub. Date: Jul. 12, 2018

(65) Prior Publication Data
US 2019/0346282 A1    Nov. 14, 2019

(30) Foreign Application Priority Data

Jan. 4, 2017 (EP) ..................................... 17020006
Mar. 30, 2017 (EP) ..................................... 17020124

(51) Int. Cl.
*G01D 4/00* (2006.01)
*G01R 22/06* (2006.01)
*G01R 22/08* (2006.01)

(52) U.S. Cl.
CPC ........... *G01D 4/008* (2013.01); *G01R 22/068* (2013.01); *G01R 22/08* (2013.01)

(58) Field of Classification Search
CPC ....... G01D 4/008; G01R 22/068; G01R 22/08
See application file for complete search history.

(56) References Cited

U.S. PATENT DOCUMENTS

| 4,987,297 | A | * | 1/1991 | le Squin | ................ | G01D 4/002 |
| | | | | | | 250/227.21 |
| 5,148,101 | A | * | 9/1992 | Balch | .................... | G01R 35/04 |
| | | | | | | 250/231.14 |
| 5,627,462 | A | | 5/1997 | Whitehead, Jr. | | |
| 6,686,731 | B2 | | 2/2004 | Tacconi | | |
| 2008/0218164 | A1 | * | 9/2008 | Sanderford | ............ | G01D 4/008 |
| | | | | | | 324/260 |

(Continued)

FOREIGN PATENT DOCUMENTS

EP  2634537  9/2013
EP  2634537 A1 * 9/2013 ............... G01D 5/32

(Continued)

*Primary Examiner* — Amine Benlagsir
(74) *Attorney, Agent, or Firm* — McHale & Slavin, P.A.

(57) ABSTRACT

The present invention provides a method for obtaining information from a utility meter, the method comprising steps of directing emitted radiation on to a rotating element of the utility meter, receiving incident radiation, the incident radiation comprising reflected radiation from a reflective surface of the rotating element, the reflective surface having a marker, determining an instant value of intensity of the incident radiation, determining a reference value from earlier ones of the determined values of the intensity of the incident radiation and detecting passing of the marker, as a function of the reference value and the instant value.

6 Claims, 4 Drawing Sheets

(56) References Cited

U.S. PATENT DOCUMENTS

2015/0015414 A1   1/2015   Gierczak et al.

FOREIGN PATENT DOCUMENTS

| GB | 2303712 | 2/1997 |
| GB | 2349945 | 11/2000 |
| WO | WO9705454 | 6/2009 |
| WO | WO2018127489 | 7/2018 |

* cited by examiner

METHOD AND A SYSTEM FOR OBTAINING INFORMATION FROM A UTILITY METER

CROSS REFERENCE TO RELATED APPLICATIONS

This is a national stage filing in accordance with 35 U.S.C. § 371 of PCT/EP2018/050057, filed Jan. 2, 2018, which claims the benefit of the priority of European Patent Application No. 17020006.7, filed Jan. 4, 2017, and European Patent Application No. 17020124.8, filed Mar. 30, 2017, the contents of each are incorporated herein by reference.

Embodiments of the present invention relate to utility meters and more particularly, to a method and a system for obtaining information from a utility meter, that are power efficient.

Sensors are known which are fixed to a utility meter such as power/water/gas meter having a rotating disc with a reflective dot or a black dot on a reflective surface of the rotating disc. The sensors are optical sensors having emitters emitting radiation towards the rotating disc and detectors (or receivers) receiving reflected radiation from the reflective surface of the rotating disc to simply detect number of rotations of the rotating disc as seen in e.g.: U.S. Pat. No. 5,627,462A, EP2634537, US2015/015414, GB2349945, GB2303712, WO97/05454 and U.S. Pat. No. 6,686,731B2.

The received detected radiation, however, will comprise also other light, such as ambient light, and the variation in the detected radiation may stem from other factors than the presence of the marker, such as when light is turned on/off in a room where the utility meter is mounted and/or if sunlight/shadow or the like varies during the day. Further, as these sensors are battery operated, it is desired to keep the emitter output intensity as low as possible, while ensuring that every rotation of the rotating disc is registered.

Additionally, the reflection of the rotating element may vary along its circumference, so it is desired to take this into account when determining the passing of the marker.

Accordingly, there remains a need in the prior art to have an improved method and an improved system for obtaining information from a utility meter which overcome the problems and shortcomings.

According to a first aspect of the present invention, there is provided a method for obtaining information from a utility meter, the method comprising steps of:
  emitting radiation on to a rotating element of the utility meter;
  receiving incident radiation comprising reflected radiation from a reflective surface of the rotating element, the reflective surface having a marker;
  at each of a plurality of points in time:
    determining, at the point of time, an instant value of intensity of the incident radiation;
    determining a reference value from values of the intensity of the incident radiation determined at other points in time of the plurality of points in time, the other points in time being earlier than the time; and
    detecting passing of the marker, as a function of the reference value and the instant value.

The method allows cancellation of undesired effects due to ambient or environmental conditions.

In the present context, a "utility meter" is an element configured to quantify a consumption or delivery of a utility, such as power, gas, water or the like. Utility meters often are provided in each house or apartment but are also used for larger numbers of houses/families or for companies and the like. Often, utility meters have a rotating element as well as a numerical readout. The rotating element often rotates a full rotation when a predetermined quantity of the utility has been consumed or delivered and the numerical readout describes a number of rotations performed by the rotatable element. The present invention relates to deriving information from the rotating element.

In the present context, the "rotating element" is a rotating disc or e.g. a rotating needle. When the rotating element is a rotating disc, the rotating disc will have one or more markers, typically along its periphery or edge, so as to provide a visible element. This marker may be more or less reflecting than other parts of the rotating disc. Usually, the radiation is directed on to an edge of the rotating disc and the marker may be a darker, less reflecting portion of the disc edge. Naturally, the edge may alternatively be less reflecting and the marker more reflective. When the rotating element is a needle or other non-circular, such as oblong, element, the radiation may be directed to a portion of the utility meter which the needle passes and the reflection of that part and that of the needle part on which the radiation impinges, may be different.

In the present context, the "information" derived from the utility meter may be the movement of the rotating element, such as a number of rotations thereof, a frequency of the rotation or the like.

In the present context, "radiation" refers to any kind of electromagnetic radiation, such as having a predefined frequency range. The radiation may be visible light, for example.

In the present context, a "reflective surface" of the rotating element, is any surface of the rotating element at which emitted radiation is directed and the surface has a non-zero reflectivity with respect to the emitted radiation.

In the present context, a "marker" may be that portion of the reflective surface which has a distinguishably higher reflectivity or a distinguishably lower reflectivity with respect to rest of the reflective surface.

In the present context, "an instant value" may be a value being estimated only in a current instance of time, such as the latest, available value. This value is determined in each of the plurality of points in time and usually will be used in the determination of the reference value for at least some later determined instant values.

The determination of the instant value and the corresponding reference value may be performed any number of times, such as 2, 3, 4, 5, 10, 20, 50, 100 times or even periodically, intermittently or permanently.

In the present context, "historic values" may be a set of values that were estimated over any period of time starting before the current instance of time and terminating before or at the current instance of time. These values are the instant values determined at earlier ones of the plurality of points in time. Thus, the reference values are determined from earlier instant values.

In the present context, "an offset" from a first value to another value refers to a difference value, such as a value obtained from subtracting the first value from the other value. Further, a "direction of offset" refers to a sign of the difference in value. If the other value is greater than the first value, the direction of the offset from the first value to the other value will be positive. Similarly, the direction of the offset from the other value to the first value will be negative. Also, if two offsets are in same direction, they are either both positive or are both negative.

In the present context, a first value "crosses" another value in a positive direction, when the first value has become greater than the other value. If however, the first value crosses the other value in a negative direction (or opposite to the positive direction), the first value has become smaller than the other value.

In one embodiment, the method further comprises an adapting step an intensity of the emitted radiation based on the reference value. This adapting may be obtained by controlling power fed to the emitter. Adapting the intensity allows saving of power in various stages, thus making the invention suitable for battery operation.

In one embodiment, the rotating element is a rotating needle or a rotating disc. Usually, the radiation is emitted toward and reflected from an edge of the rotating disk. Often, the radiation emitter and detector are positioned in a plane of the rotating disc. When the rotating element is a rotating needle, the radiation may be directed toward a position which is passed by the needle so that the passing of the needle may be determined from the reflected radiation. As to the needle, the marker may be a portion of the needle passing the beam of radiation.

In one embodiment, the step of determining the instant value comprises a step of determining the instant value continuously. Continuous determination has the advantage that detection of the marker is ensured. This is suitable in applications where the rotating element is rotating at a fairly high rate. However this gives a higher power consumption and is rather inefficient in applications where the rotating element is rotating with a very small angular velocity.

In one embodiment, the step of determining the instant value comprises a step of determining the instant value intermittently. Intermittent determination reduces power consumption is suitable where the rotating element is not expected to be rotating at a too high rate.

Naturally, the reference value may be determined in a number of manners. In the present context, it is desired that the reference value varies with the instant value, so as to be able to adapt to the variations in ambient light, but slower, so that the passing of the marker may be detected. One type of mathematical operation providing such behavior is a mean value. Mean values may be determined in a number of manners. In one embodiment, the reference value is a running mean of the historic values, such as a running mean of historic values obtained over a predetermined period of time or simply a predetermined number of historic values (typically the latest ones). For example the running mean may be calculated over the latest 2, 4, 8, 16, 32, 64 values. Naturally any number of values may be used. A reference value, such as s running mean, may alternatively be determined on the basis of the values obtained during a predetermined period of time ending with the present or former point in time, such as the latest 1-1000 seconds, such as 5-100 seconds or 5-20 seconds.

In one embodiment, the reference value, such as a running mean, is updated after every first predetermined period of time. Such as every interval of 0.1-100 Hz, 1-50 Hz or 1-5 Hz depending upon the application. Alternatively, the reference value may be updated for each instant value determined.

In one embodiment, the detecting step further comprises a step of determining a first threshold value from the reference value In one embodiment, the detecting step further comprises the step of updating the first threshold value so as to ensure that the first threshold value is always at a first minimum offset from the reference value. Where the marker is less reflective than rest of the reflective surface, the first threshold may be determined to be smaller than the reference value, whereas, if the maker is more reflective than the rest of the surface, the first threshold value preferably is determined to be larger than the reference value.

In one embodiment, the detecting step further comprises a step of determining a second threshold value from the reference value or the first threshold value, the second threshold value being at a second minimum offset from the first threshold value, wherein the first minimum offset and the second minimum offset are in a same direction. The first threshold preferably constantly is between the reference value and the second threshold.

The second threshold may be calculated to ensure that the detection of the marker is not a result of variations in the ambient light. Hence, a second minimum offset is maintained with the first threshold to ensure that rather small variations caused in the intensity of incident radiation due to ambient conditions are ruled out.

In one embodiment, the detecting step further comprises the step of determining a third threshold value from the historic values, corresponding to a second predetermined period of time. The third threshold value may act as a lower boundary of the second threshold value to ensure that the second threshold is not determined to be an unrealistically low value.

In one embodiment, the method further comprises the step of assigning a predefined set of values to the reference value and any of the first, second and third thresholds used, when the reference value falls outside of a predefined value or interval. The predefined set of values may ensure that most occurrences of the marker would still be registered.

In one embodiment, the passing of the marker is detected, when the instant value first crosses the second threshold value in the direction of the first and the second minimum offsets, followed by the instant value crossing the first threshold value in a direction opposite to the direction of the first and the second minimum offsets. In this manner, errors will be taken into account, caused by e.g. ambient light intensity falling due to ambient light turned on/off and back off/on again or if a cloud passes in front of the sun.

In one embodiment, the detecting step further comprises the step of keeping the first threshold value and the second threshold value constant, between a point in time where the instant value crosses the second threshold value and a point I time where the instant value crosses the first threshold value. Thus, the thresholds are fixed during passing of the marker as the reference value, which is based on historic values, due to the different reflection of the marker, might otherwise deviate from desired values and thereby drag the thresholds out of a desirable range.

In one embodiment, the method further comprises the step of determining a marker width interval between the instant value crossing the second threshold value and then crossing the first threshold value. Then, a next assumed detection of the passing of the marker may be discarded, if a determined marker width thereof is smaller than a predetermined fraction of the width interval of a previous marker detected. This helps discarding spurious signals or false positives of the passing of the marker. Naturally, the marker width will depend on the speed of the rotating element and may therefore vary. This may be taken into account in the determination of the fraction, so that some speed deviations may be accepted but very large speed deviations will result in a width variation too large and thus can be discarded.

In one embodiment, the adapting step further comprises a step of deactivating the emitted radiation, such as the radiation emitter, for a third predetermined period of time. Deactivating the radiation emitter for a period of time will, naturally, save power. On the other hand, it is desired to ensure that a next passing of the marker is detected, so that the radiation emitter is deactivated for only a portion of the time expected between passings of the marker. An alternative to the deactivation of the radiation emitter is a reduction in a frequency of emission of radiation pulses and/or a reduction in pulse width.

In one embodiment, the adapting step further comprises a step of emitting the emitted radiation as pulses of a predetermined pulse width duration and at a predetermined frequency. This reduces the intensity of the emitted radiation between the detection of the passing of the marker and the next detection of the passing of the marker. This will again save power, while still being able to receive radiation reflected from the reflective portion of the rotating element.

In one embodiment, the predetermined frequency lies in a range of 1-100 Hz, such as 1-50 Hz, such as 3-30 Hz, where a high frequency could be 20-100 Hz and a low frequency 1-20 Hz, and the pulse width duration lies in a range of 2 microseconds to 3.5 milliseconds, where a small pulse width could be 2-500 microseconds and a large pulse width is 0.5-3.5 milliseconds.

In one embodiment, the adapting step further comprises adapting the intensity of the emitted radiation also on basis of the instant value.

A second aspect of the invention relates to a system for obtaining information from a utility meter, the system comprising:
  a radiation emitter configured to direct emitted radiation on to a rotating element of the utility meter
  a radiation detector configured to receive incident radiation comprising reflected radiation from a reflective surface of the rotating element, the reflective surface having a marker;
  a control module configured to, at each of a plurality of points in time:
    determine, at the point in time, an instant value of intensity of the incident radiation;
    determine a reference value from values of the intensity of the incident radiation determined at other points in time of the plurality of points in time, the other points in time being earlier than the point in time; and
    detect passing of the marker as a function of the reference value and the instant value.

In this respect, a radiation emitter may be an element configured to output radiation. In principle, any wavelength or wavelength interval may be used. The radiation emitter may be a laser, a laser diode, an LED, and OLED or any other type of radiation emitter.

A radiation detector may be based on any type of technology, such as a cascade technology, CCD technology or the like. The radiation detector outputs a signal correlated to an intensity of radiation received. Naturally, an optical filter may be provided in front of the radiation detector to remove undesired wavelengths.

The control module may be formed of any type of processor, ASIC, controller, DSP, chip or the like. The control module may be a monolithic element or provided as a number of elements in communication with each other. Naturally, the control module may have a power supply and inputs/outputs for the radiation emitter, the radiation detector, a display, user interface or the like, if desired. Also communication elements may be provided for receiving instructions for the control module or for outputting e.g. the information derived, such as a frequency of markers passing, a number of markers passing or points in time of passings of the marker.

In one embodiment, the control module is further configured to instruct the radiation emitter to adapt an intensity of the emitted radiation based on the reference value.

In one embodiment, the rotating element is a rotating needle or a rotating disc.

As mentioned above, any number of points in time may be used.

In one embodiment, the control module is further configured to determine the instant value continuously, such as at points in time as closely positioned as possible.

In one embodiment, the control module is further configured to determine the instant value intermittently, so that there is e.g. a predetermined or even constant period of time between the points in time.

The reference value is determined from ones of the determined instant values. The historic instant values used may be selected in a number of manners, such as the latest 2, 3, 5, 10, 20 or any other number of instant values. Alternatively, the instant values may be used which are determined during a predetermined period of time before the present point in time, such as a period of time ending with the present point in time.

In one embodiment, the reference value is a running mean of the historic values used.

In one embodiment, the control module is further configured to update the reference value after every first predetermined period of time. The reference value may be determined for each instant value or each point in time.

In one embodiment, the control module is further configured to determine a first threshold value from the reference value.

In one embodiment, the control module is further configured to update the first threshold value so as to ensure that the first threshold value is always at a first minimum offset from the reference value.

In one embodiment, the control module is further configured to determine a second threshold value from the reference value or the first threshold value, the second threshold value being at a second minimum offset from the first threshold value, wherein the first minimum offset and the second minimum offset are in a same direction.

In one embodiment, the control module is further configured to determine a third threshold value from the historic values, corresponding to a second predetermined periods of time.

In one embodiment, the control module is further configured to assign a predefined set of values to the reference value and any of the first, the second and the third thresholds used, when the reference value is smaller than a predefined design constant.

In one embodiment, the control module is further configured to detect the passing of the marker, when the instant value first crosses the second threshold value in the direction of the first and second minimum offsets followed by the instant value crossing the first threshold value, in a direction opposite to the direction of the first and the second minimum offsets.

In one embodiment, the control module is further configured to keep the first threshold value and the second threshold value constant, between the instant value crossing the second threshold value and then crossing the first threshold value.

In one embodiment, the control module is further configured to determine a marker width interval between the instant value crossing the second threshold value and then crossing the first threshold value.

In one embodiment, the control module is further configured to deactivate the radiation emitter for a third predetermined period of time.

In one embodiment, the control module is further configured to instruct the radiation emitter to emit the emitted radiation as pulses of a predetermined pulse width interval and at a predetermined frequency.

In one embodiment, the predetermined frequency lies in a range of 30-100 Hz and the pulse width duration lies in a range of 2 microseconds to 3.5 milliseconds.

In one embodiment, the control module is further configured to instruct the radiation emitter to adapt the intensity of the emitted radiation as a function of the instant value.

In one embodiment, the system further comprises a battery configured to provide power to the radiation emitter, the radiation detector and the control module.

So that the manner in which the above recited features of the present invention can be understood in detail, a more particular description of the invention, briefly summarized above, may have been referred by embodiments, some of which are illustrated in the appended drawings. It is to be noted, however, that the appended drawing illustrate only typical embodiments of this invention and are therefore not to be considered limiting of its scope, for the invention may admit to other equally effective embodiments.

These and other features, benefits, and advantages of the present invention will become apparent by reference to the following text figure, with like reference numbers referring to like structures across the views, wherein.

Figure 1:
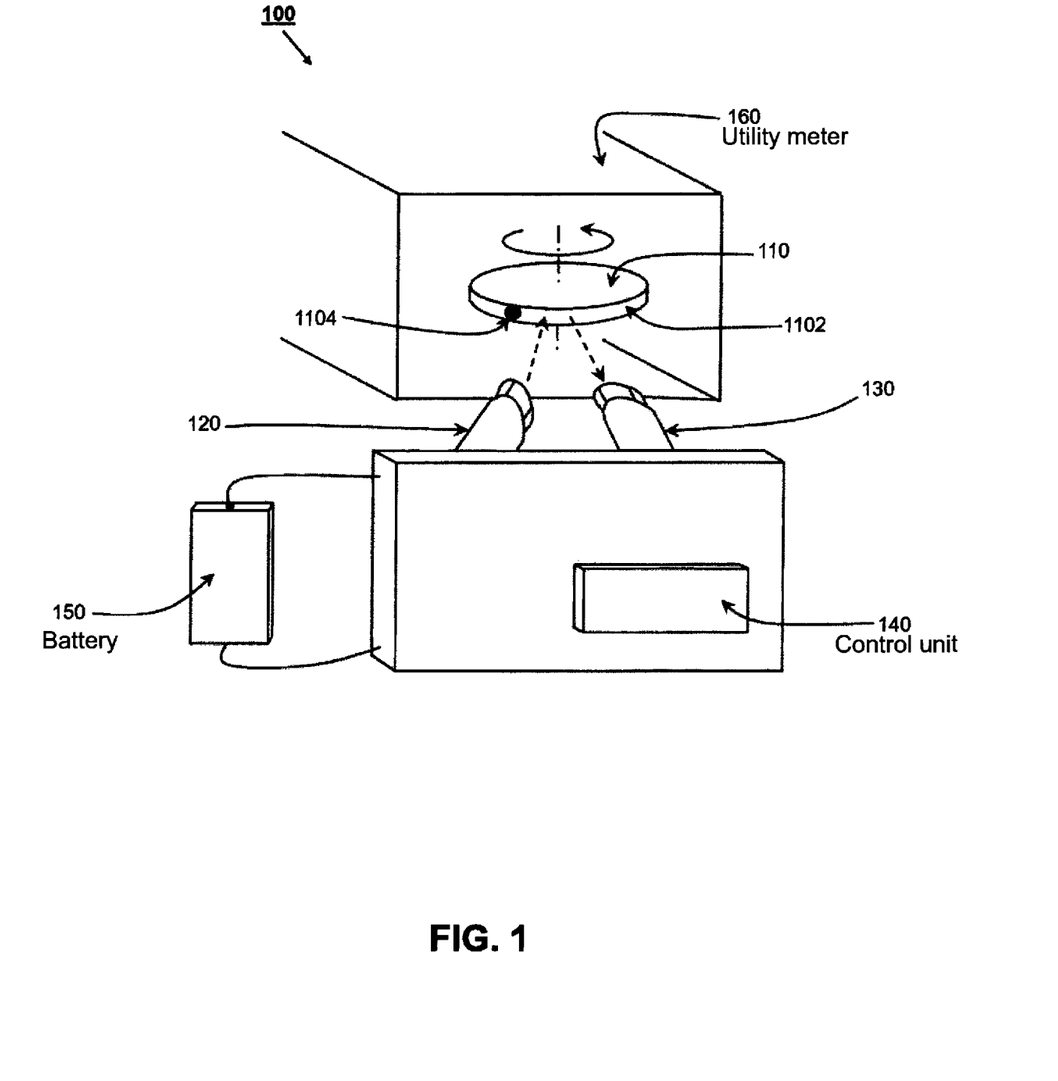
FIG. 1 illustrates a system for obtaining information from a utility meter, In one embodiment.

As shown in FIG. 1, a system 100 for obtaining information from a utility meter 160 In one embodiment, comprises a radiation emitter 120, a radiation detector 130 and a control module 140. Further, the system 100 comprises a battery 150, configured to provide power to the radiation emitter 120, the radiation detector 130 and the control module 140. The radiation emitter 120 is configured to direct emitted radiation on to a rotating element 110 of the utility meter 160.

Positioning of the system may be seen in the Applicant's co-pending application with the title "A SENSOR AND A METHOD FOR READING A UTILITY METER" filed on even date. A suitable set-up of the system may be seen in Applicant's co-pending application with the title "A UTILITY METER READER FOR READING A UTILITY METER AND A METHOD OF READING A UTILITY METER" filed on even date. Both references are incorporated herein in their entireties by reference.

In one embodiment, the radiation emitter 120 is a laser. The use of a laser allows sufficient amount of radiation on the rotating element 110, when the rotating element 110 is at a substantial distance from the radiation emitter 120. Further, In one embodiment, the rotating element 110 is a rotating disc or a rotating needle. Usually, the radiation is emitted toward and reflected from an edge of the rotating element 110. Often, the radiation emitter 120 and radiation detector 130 are positioned in a plane of the rotating disc. When the rotating element 110 is a rotating needle, the emitted radiation may be directed toward a position which is passed by the needle so that the passing of the needle may be determined from the reflected radiation.

The radiation detector 130 is configured to receive incident radiation. The incident radiation comprises reflected radiation from a reflective surface 1102 of the rotating element 110. Further, the reflective surface 1102 has a marker 1104, such as, but not limited to a black dot. As to the needle, the marker 1104 may be a portion of the needle passing the beam of radiation. The marker 1104 has a lower reflectivity compared to a remaining portion of the reflective surface 1102. Alternatively, the marker 1104 may have a higher reflectivity compared to other portions of the reflective surface 1102. Therefore, an intensity of the reflected radiation from the marker 1104 will be different from that from the rest of the reflective surface 1102.

Consequently, the intensity of the incident radiation during passing of the maker 1104 will also be different compared to the rest of the reflective surface 1102. Additionally, the incident radiation may not only comprise reflected radiation but also ambient light, such as light from light bulbs, the sun and other light sources. Variations in the detected radiation thus stems not only from the passing of the marker but also from variations in ambient light, such as the light turned on/off and the amount of sunlight available at different times of the day or during different weather conditions.

The control module 140 is configured to determine an instant value of the intensity of the incident radiation. The control module 140 is configured to determine the instant value continuously, in real time. Continuous determination has the advantage that detection of the marker 1104 is ensured. This is suitable in applications where the rotating element 110 is rotating at a fairly high rate. However this gives a higher power consumption and is rather inefficient in applications where the rotating element 110 is rotating with a moderate or a very small angular velocity.

Alternatively, the control module 140 is configured to determine the instant value intermittently, such as at short intervals. This may still be seen as being in real time. The control module 140 is configured to determine the instant value with a frequency of 60 Hz. However, the interval may vary in various embodiments, as per the design requirements. Intermittent determination reduces power consumption and is suitable where the rotating element 110 is not expected to be rotating at a high rate. The frequency may be increased at points in time where the marker is expected to pass or when a high consumption (rotational velocity) is expected or determined.

Further, the control module 140 is configured to determine a reference value from historic values of the determined intensity of the incident radiation. The reference value is a running mean of the historic values of the intensity of incident radiation, such as a running mean of historic values obtained over a predetermined period of time or simply a predetermined number of historic numbers/values (typically the latest ones). For example, the running mean may be calculated over the latest sixteen values. Running means are simple to calculate and may be determined during the latest 1-1000 seconds, 5-100 seconds or 5-20 seconds. Further, the control module 140 may be configured to update the reference value after every first predetermined period of time. The first predetermined period of time may be 500 milliseconds. Other such periods may be selected as per design requirements. The control module 140 is further configured to detect passing of the marker 1104 as a function of the reference value and the instant value.

Figure 2:
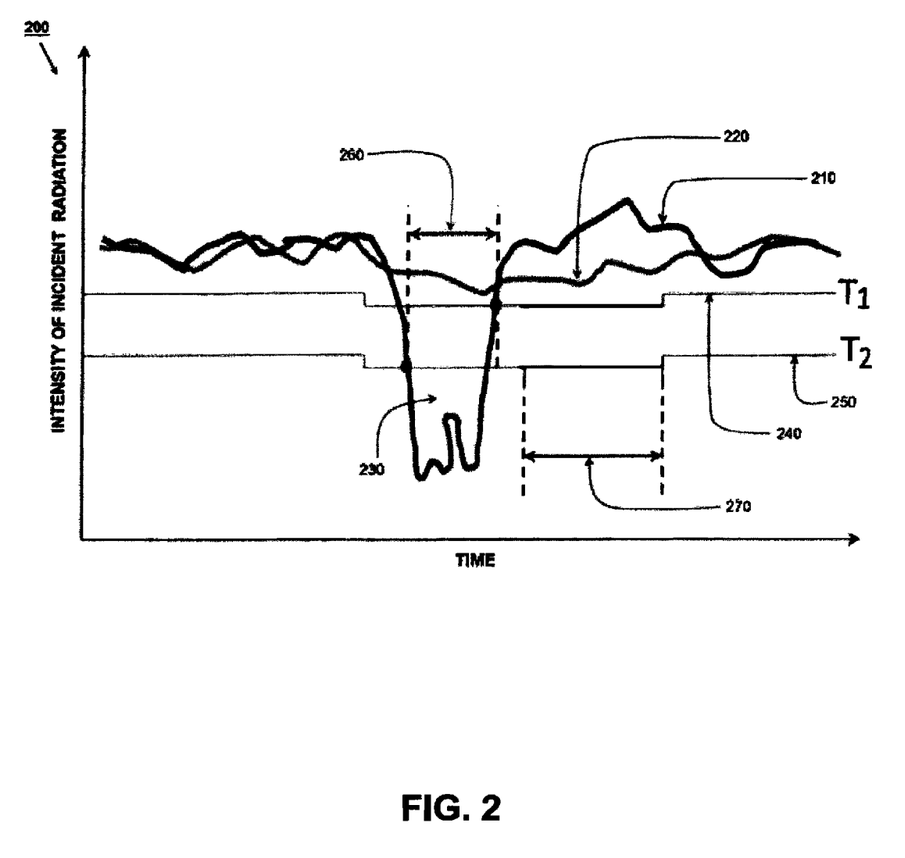
FIG. 2 illustrates an Intensity—Time plot of incident radiation, received at a radiation detector, In one embodiment.

FIG. 2 illustrates an Intensity—Time plot of the incident radiation received at the radiation detector 130, where the marker 1104 has a lower reflectivity compared to the rest of the reflective surface 1102. Plot 210 denotes the instant value of the intensity of the incident radiation. Plot 220 denotes the reference value. As can be seen from FIG. 2, trough 230 denotes passing of the marker 1104.

Figure 3:
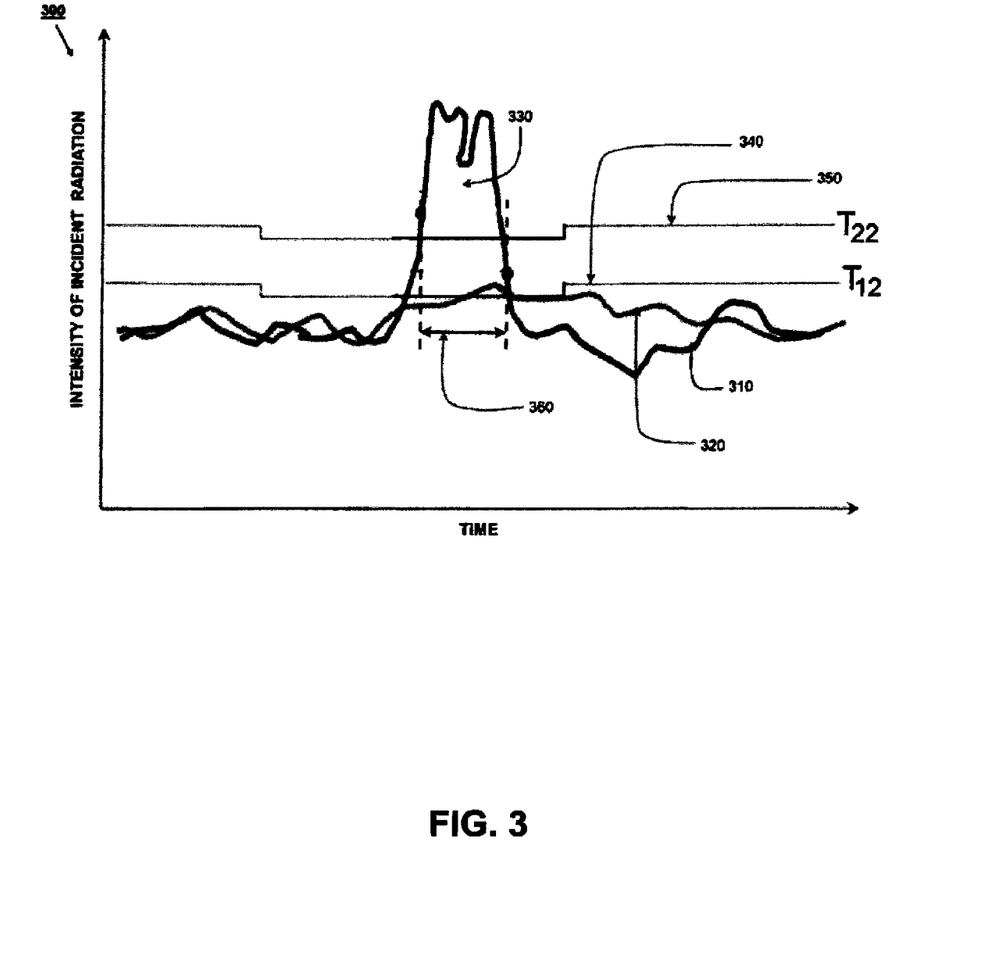
FIG. 3 illustrates the Intensity—Time plot of incident radiation, received at the radiation detector, in accordance with another embodiment of the present invention.

FIG. 3 illustrates the Intensity—Time plot of the incident radiation received at the radiation detector 130, where the marker 1104 has higher reflectivity compared to the rest of the reflective surface 1102. Plot 310 denotes the instant value of the intensity of the incident radiation. Plot 320 denotes the reference value. As can be seen from FIG. 3, crest 330 denotes passing of the marker 1104.

The control module 140 is further configured to determine a first threshold value from the reference value. The first threshold value is denoted by plot $T_1$ 240 in FIG. 2 and by plot $T_{12}$ 340 in FIG. 3. The control module 140 is further configured to update the first threshold value so as to ensure that the first threshold value is always offset at least a first minimum from the reference value. In FIG. 2, the first minimum offset is a negative value, whereas in FIG. 3, the first minimum offset is a positive value.

Taking the example of embodiment 300, each time an instant value is determined or each time the reference value is updated, the reference value is compared to the first threshold value, and if a difference value obtained from subtracting the reference value from the first threshold value is smaller than the first minimum offset, the first threshold value is re-calculated. The first minimum offset may take into account for example a situation where the instant value becomes higher than the reference value (the reference value preferably adapts slower to changes than the instant value). For not too large changes, the control module 140 should not assume that the marker is passing. In this manner, the first threshold value is so high that if the instant value passes it (becomes higher), the marker may be passing or another event takes place, such as when ambient light is turned off.

Naturally, it will be possible to determine the passing of the marker using the first threshold value, but it is preferred that the control module 140 is further configured to determine a second threshold value from reference value or the first threshold value. The second threshold value is at a second minimum offset from the first threshold value. Further, the first minimum offset and the second minimum offset are in a same direction. This means that both the first minimum offset are either positive or negative. The second threshold value is denoted by plot $T_2$ 250 in FIG. 2 and by plot $T_{22}$ 350 in FIG. 3. The second threshold is calculated to ensure that the detection of the marker is not a result of variations in the ambient light. Hence a second minimum offset is maintained with the first threshold to ensure that rather small variations caused in the intensity of incident radiation due to ambient conditions are ruled out.

Further, the control module 140 is further configured to determine a third threshold value from the historic values. Lowest values of the historic values corresponding to a second predetermined period of time are considered in embodiment 200. For example, the third threshold value may be a lowest value of the historic values for a period of time in order of days or weeks. In another embodiment, the third threshold value is a low running average over a number of lowest values, determined over, for example, a fifteen minute interval.

Highest values of the historic values corresponding to a second predetermined periods of time are considered in embodiment 300. For example, in one embodiment, the third threshold value is a highest value of the historic values for a period of time in order of days or weeks. In another embodiment, the third threshold value is a high running average over a number of highest values, determined over, for example, a fifteen minute interval.

The third threshold value represents a boundary for the second threshold value so that second threshold value preferably never is smaller or larger, as the case may be, than the third threshold value.

However, false reflections and other intensity increases may be seen during the passing of the marker 1104. This is seen at the bottom of the trough of the curve 210 in FIG. 2 or at the top of the crest 310 in FIG. 3. Thus, the marker is preferably determined only when the instant value again exceeds the first threshold. The control module 140 is further configured to detect the passing of the marker 1104 when the instant value first crosses the second threshold value in the direction of the first and second minimum offsets followed by the instant value crossing the first threshold value, in a direction opposite to the direction of the first and the second minimum offsets.

In embodiment 200, as shown in FIG. 2, the marker 1104 is detected when the instant value first becomes smaller than the second threshold value, followed by the instant value becoming greater than the first threshold value. In embodiment 300, as shown in FIG. 3, the marker 1104 is detected when the instant value first becomes larger than the second threshold value, followed by the instant value becoming smaller than the first threshold value.

The control module 140 is further configured to keep the first threshold value and the second threshold value constant, between the instant value crossing the second threshold value and then crossing the first threshold value. Thus, the first threshold value and the second threshold value are fixed during the trough 230 in FIG. 2 and crest 330 in FIG. 3. This is to, among other things, take into account the fact that the running mean will deviate from an expected trend, due to the reduced reflection at the marker 1104. In fact, the updating of the threshold(s) may be postponed to also a period of time 270 after the end of the marker (the instant value exceeding the first threshold) in order to allow the reference value to recover from the lower intensity caused by the marker.

Alternatively, the reference value may be determined only on the basis of instant values not within the marker, so that when the curve 210 passes the second threshold value on its way into the trough 230, updating of the reference values is stopped, and when the curve 210 again exceeds the first threshold value, values of the curve 210 between these two passings are not used in the calculation of the reference value. Then, the thresholds may be re-determined as soon as the trough 230 has passed.

In one embodiment, the control module 140 is further configured to assign a predefined set of values to the reference value and any of the first, the second and the third thresholds used, when the reference value is smaller than a predefined design constant. This may be the situation if the sensor head is positioned wrongly in relation to the utility meter, so that the reflected radiation is much less than ideal or if the ambient lighting is excessive. Then the predefined set of values ensure that the passing of the marker 1104 would still be detected for most of the occurrences.

The control module 140 is further configured to determine a marker width interval between the instant value crossing the second threshold value and then crossing the first threshold value. Periods 260 in FIGS. 2 and 360 in FIG. 3 illustrate the respective marker width intervals of embodiment 200 and 300. Then, a next detection of the passing of the marker may be discarded, if a determined marker width thereof is smaller than a predetermined fraction of the width interval of a previous marker detected. This helps discarding spurious signals or false positives of the passing of the marker 1104. Naturally, the marker width interval will depend on the speed of the rotating element 110 and may therefore vary. This may be taken into account in the determination of the fraction, so that some speed deviations may be accepted but very large speed deviations will result in a width variation too large and thus are discarded. A too wide or too narrow crest or trough may be caused by other effects, such as a cloud passing before the sun. this expected width or expected marker width interval may be determined from historical widths (rotation speeds), use patterns of the utility (more power used at points in time of cooking than in the middle of the day or in the middle of the night) or the like.

Further, the control module 140 is configured to instruct the radiation emitter 120 to adapt intensity of the emitted radiation based on the reference value. This saves power, which is especially desirable when the system 100 is powered by the battery 150. The control module 140 is further configured to deactivate the radiation emitter 120 for a third predetermined period of time. Deactivating the radiation emitter 120 for a period of time will, naturally, save power. On the other hand, it is desired to ensure that a next passing of the marker 1104 is detected, so that the radiation emitter 120 is deactivated for only a portion of the time expected between passings of the marker.

Further, it may be desired to reduce the intensity of emitted radiation, at least partially or intermittently. The control module 140 may be configured to instruct the radiation emitter 120 to emit the emitted radiation as pulses of a predetermined pulse width interval and at a predetermined frequency. For example in FIG. 2, during period 270, the radiation emitter 120 emits radiation in pulses of very low pulse width duration and at a fairly low frequency. This reduces the intensity of the emitted radiation between the detection of the passing of the marker and the next detection of the passing of the marker. This will again save power, while still being able to receive radiation reflected from the reflective portion of the rotating element.

The predetermined frequency lies in a range of 30-100 Hz and the pulse width duration lies in a range of 2 microseconds to 3.5 milliseconds. The lower pulse width duration may be maintained for e.g. 0-80%, or 0-60%, or 0-50% of a period of time from the passing of the marker to an expected next point in time of passing of the marker. This next point in time may be determined from points in time of subsequent passings of the marker, the time it took for the marker to pass the last time or the like.

Power may also be saved during detection of the passing of the marker 1104. The control module 140 is further configured to instruct the radiation emitter 120 to adapt the intensity of the emitted radiation as a function of the instant value. If the instant value of the intensity of the incident radiation is higher than required, the intensity of emitted radiation may be lowered to save power. Various embodiments of a method for adapting intensity of emitted radiation during operation of a utility meter, may now be understood taking the embodiments of the system 100 as reference.

Figure 4:
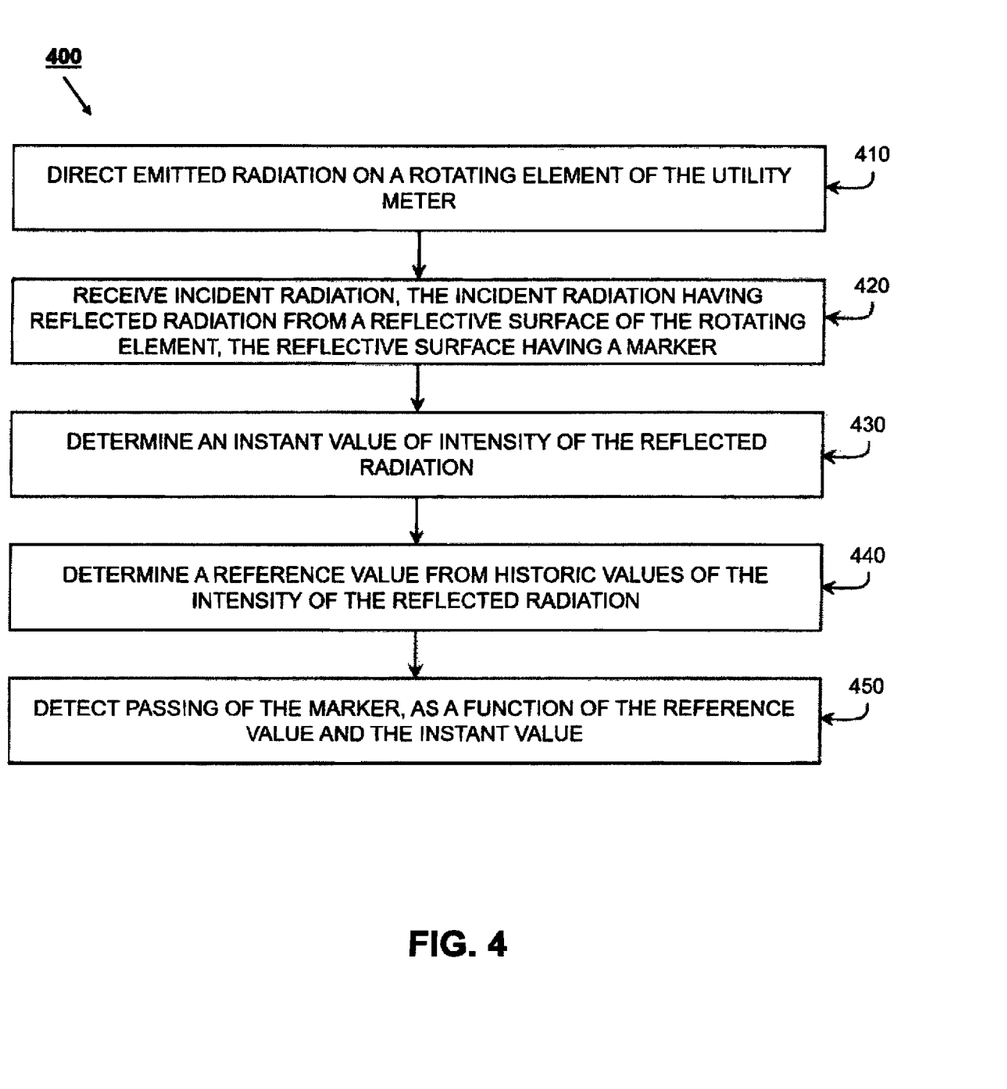
FIG. 4 illustrates a method for obtaining information from a utility meter, In one embodiment.

FIG. 4 illustrates a method 400 for obtaining information from the utility meter 160. The method begins at step 410 by emitting radiation on the rotating element 110 of the utility meter 160. The emitted radiation is projected by the radiation emitter 120. At step 420, the incident radiation is received at the radiation detector 130. As mentioned above, the incident radiation comprises the reflected radiation from the reflective surface 1102 of the rotating element 110. At step 430, the instant value of the intensity of the incident radiation is determined by the control module 140. The instant value is determined continuously, in real time, by the control module 140. Alternatively, the instant value is determined intermittently, by the control module 140.

At step 340, the reference value is determined by the control module 140, from the historic values of the intensity of the incident radiation. At step 350, the passing of the marker 1104 is detected, as a function of the reference value and the instant value, by the control module 140. The control module 140 determines the first threshold value from the reference value. Further, the control module 140 updates the first threshold value so as to ensure that the first threshold value is always at at least a first minimum offset from the reference value. Then, the control module 140 determines the second threshold value from the reference value or the first threshold value and the third threshold value from the historic values, corresponding to the second predetermined period of time.

The passing of the marker 1104 is detected by the control module 140, when the instant value first crosses the second threshold value in the direction of the first and the second minimum offsets followed by the instant value crossing the first threshold value in a direction opposite to the direction of the first and the second minimum offsets. The control module (140) keeps the first threshold value and the second threshold value constant, between the instant value crossing the second threshold value and then crossing the first threshold value.

The control module 140 further assigns the predefined set of values to the reference value and any of the first, second and the third thresholds used, when the reference value is smaller than the predefined design constant.

Also, the control module 140 determines the marker width interval between the instant value crossing the second threshold value and then crossing the first threshold value.

To save power the control module 140 adapts the intensity of the emitted radiation based on the reference value. The control module 140 deactivates the emitted radiation by deactivating the radiation emitter 120 for a third predetermined period of time. The control module 140 instructs the radiation emitter 120 to emit the emitted radiation as pulses of the predetermined pulse width duration and at the predetermined frequency. The control module 140 instructs the radiation emitter 120 to adapt the intensity of the emitted radiation also on basis of the instant value.

The method and the system discussed above allow cancellation of noise caused due to environmental or ambient conditions. Also, power can be saved using a number of strategies, making the invention suitable for battery operation. A number of variables can be introduced at any time to enhance the overall accuracy of the invention even further.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claim.

The invention claimed is:

1. A method for obtaining information from a utility meter, the method comprising steps of:
   emitting radiation on to a rotating element of the utility meter;
   receiving incident radiation from the emitted radiation comprising reflected radiation from a reflective surface of the rotating element, the reflective surface having a marker,
   determining an instant value of intensity of the incident radiation;
   determining a reference value from values of the intensity of the incident radiation;
   detecting passing of the marker, as a function of the reference value and the instant value of the intensity of the incident radiation by:
   determining a first threshold value from the reference value, determining a second threshold value from the reference value or the first threshold value, the second threshold value being at a second minimum offset from the first threshold value, wherein a first minimum offset and the second minimum offset are in a same direction, and
   said detecting passing of the marker when the instant value first crosses the second threshold value in the same direction of the first and the second minimum offsets followed by the instant value crossing the first threshold value in a direction opposite to the same direction of the first and the second minimum offsets,
   wherein the detecting passing of the marker further comprises:
   keeping the first threshold value and the second threshold value constants, between the instant value crossing the second threshold value and then crossing the first threshold value, and
   updating the first threshold value so as to ensure that the first threshold value is always at the first minimum offset from the reference value.

2. The method as claimed in claim 1, wherein said determining the instant value of the intensity of the incident radiation comprises a step of determining the instant value continuously or intermittently.

3. The method as claimed in claim 1, wherein the reference value is a running mean of the values of the intensity of the incident radiation determined at the other points in time.

4. A system for obtaining information from a utility meter, the system comprising:
   a radiation emitter configured to direct emitted radiation on to a rotating element of the utility meter;
   a radiation detector configured to receive incident radiation from the emitted radiation comprising reflected radiation from a reflective surface of the rotating element, the reflective surface having a marker;
   a control module configured to, at each of plurality of points in time:
   determine an instant value of intensity of the incident radiation;
   determine a reference value from values of the intensity of the incident radiation;
   determine a first threshold value from the reference value,
   determine a second threshold value from the reference value or the first threshold value, the second threshold value being at a second minimum offset from the first threshold value, wherein a first minimum offset and the second minimum offset are in a same direction, and
   detect passing of the marker when the instant value first crosses the second threshold value in the same direction of the first and second minimum offsets followed by the instant value crossing the first threshold value, in a direction opposite to the same direction of the first and the second minimum offsets,
   wherein the control module is further configured to keep the first threshold value and the second threshold value constants, between the instant value crossing the second threshold value and then crossing the first threshold value.

5. The system as claimed in claim 4, wherein the control module is further configured to determine the instant value continuously or intermittently.

6. The system as claimed in claim 4, wherein the reference value is a running mean of the values of the intensity of the incident radiation determined at said each of the plurality of points in time.

* * * * *